SEMICONDUCTOR DIODE RECOVERY TESTER

Filed Aug. 18, 1958

JOSEPH M. STERN,
RICHARD H. FULLER,
INVENTORS.

BY Spensley and Horn

ATTORNEYS.

United States Patent Office 2,999,983

Patented Sept. 12, 1961

2,999,983

SEMICONDUCTOR DIODE RECOVERY TESTER

Joseph M. Stern, Los Angeles, and Richard H. Fuller, Playa Del Rey, Calif., assignors to Pacific Semiconductors, Inc., Culver City, Calif., a corporation of Delaware Filed Aug. 18, 1958, Ser. No. 755,593
8 Claims. (Cl. 324—158)

The present invention relates to an electronic circuit and more particularly to a detector circuit capable of metering the reverse recovery effect of an asymmetrically conductive electronic device.

The reverse recovery time of a semiconductor diode may be stated to be the time in which the bias can be reversed on a diode without markedly degrading the reverse resistance. When a semiconductor diode is switched from a forward biased state to a reverse biased state, a large transient reverse current flows initially.

Present art circuits for making quantitative measurements of this reverse recovery current as a function of time from switching, are commercially available. These present art circuits are generally capable of making accurate measurements within their restricted range of forward current and reverse voltage at times greater than 0.3 micro seconds from the time of switching. One such circuit is the recovery tester of the shunt vacuum diode type. This type circuit will be described hereinafter.

While the shunt vacuum diode circuit is adequate within its specified range of operation, it does not provide accurate measurements at sufficiently short time from switching, nor does it provide adequate forward bias and reverse bias coverage. It will not, for example, permit accurate measurement of the recovery time of many of the diffused silicon computer diodes presently commercially available. Further, in many transistorized circuits which use semiconductor diodes, the high forward currents required cannot be simulated. Accuracy of measurement at short recovery times, i.e., less than 0.3 micro seconds, is impaired in this type tester by limited high frequency response of the unit. The high frequency response, in turn, is limited by the shunt capacitance present in the vacuum tube diode used to shunt the current sensing resistor during forward conduction of the test diode. Bias conditions for the diode being tested are limited by the maximum power available from the pulse generator used to drive the tester.

Other prior art circuits of the character herein described also have certain shortcomings. One such device is the shunt semiconductor diode recovery tester. The range of bias conditions of this tester is not appreciably greater than that of the vacuum diode tester. The latter circuit differs primarily from the former in the substitution of a semiconductor diode for the shunt vacuum tube diode previously referred to. The shunt capacitance is reduced by this technique; however, the semiconductor shunting diode also suffers from the very same recovery phenomenon under discussion, the very parameter which it is desired to measure. Thus, errors may be introduced at short viewing times, the errors being a function of the particular reverse recovery characteristics of the semiconductor shunting diode employed in the circuit.

Another prior art reverse recovery time tester (the pentode output recovery type tester), eliminates all shunt diodes thereby permitting accurate measurement of fast recovery diodes. This type of circuit, hereinafter to be described, has other shortcomings. The power required from the signal generator in order to test a diode at a specific forward current and reverse voltage is significantly greater than that required in a shunt vacuum type tester. Hence, the range of allowable bias conditions is restricted relative to the latter type tester by the maximum power output from the square wave generator. Further, the rise-time of the pulse output from the square wave generator when terminated as required by the pentode output recovery tester, is longer than the minimum desired test time (0.1 micro second rise as opposed to a 0.05 micro second minimum test). A large electrical potential exists between the diode test clips and the oscilloscope chassis. Since both of these points must be accessible to the operator, an obvious hazard exists. Further, the pentode output stage produces distortion in signal swings in excess of 1.5 volts, this introduces further inaccuracy since quantative measurements are made on signals of this order of magnitude. Finally, high frequency response of the output stage is less than is desirable.

The device of the present invention overcomes all of the hereinabove mentioned shortcomings attendant in the present art recovery testers while permitting accurate measurement of recovery times considerably less than 0.3 micro seconds.

It is therefore an object of the present invention to provide an improved detector of the reverse recovery characteristic of an asymmetrically conductive device.

Another object of the present invention is to provide an improved detection of the reverse recovery effect in a semiconductor diode to a degree of accuracy heretofore unobtainable.

A further object of the present invention is to provide a semiconductor reverse recovery test device having an improved high frequency response with improved linearity at the output stage.

While the novel and distinctive features of the invention are particularly pointed out in the appended claims, a more expository treatment of the invention, in principle and in detail, together with additional objects and advantages thereof, is afforded by the following description and accompanying drawing in which like reference characters are used to refer to like parts throughout.

Figures 1, 2:
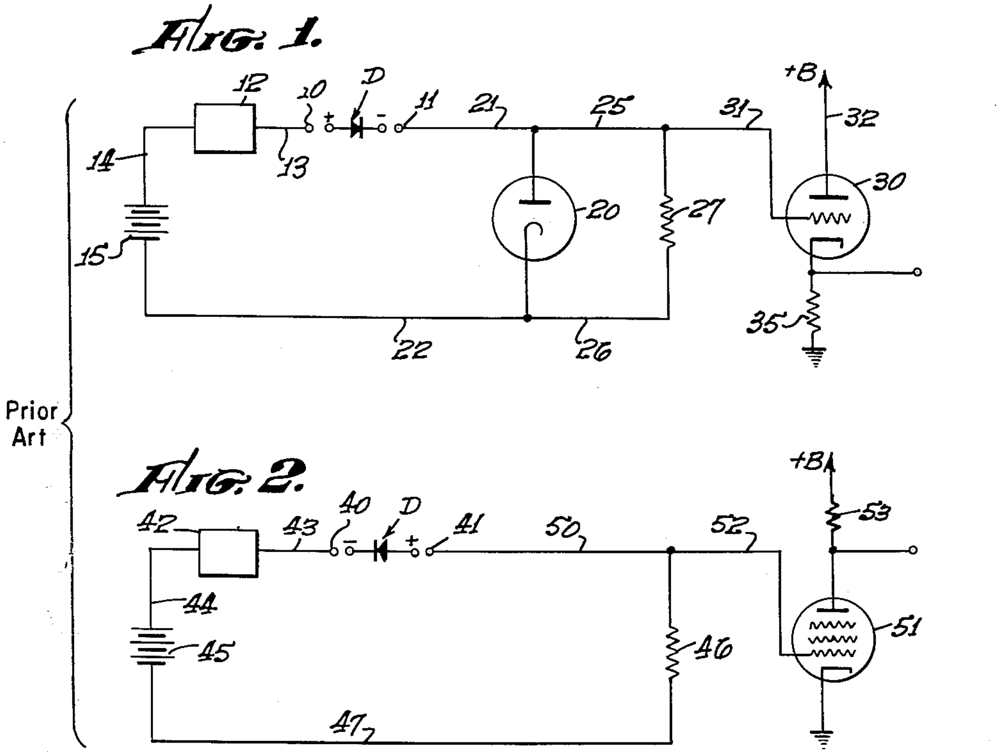
FIGURE 1 is a simplified schematic view of one prior art type of reverse recovery tester.
FIGURE 2 is a simplified schematic view of another prior art type of reverse recovery tester.

Referring now to the drawing, and more particularly to FIGURE 1 there is shown a simplified recovery tester of the shunt vacuum diode type. In this circuit the diode to be tested will be inserted between terminal points 10 and 11. A square wave generator 12 is connected over lead 13 to terminal 10 at one end thereof, while the other terminal of the square wave generator is connected through lead 14 to the positive terminal of a biasing battery 15. A vacuum tube diode 20 is connected across leads 21 and 22 thus coupling the plate and cathode of the diode 20 to terminal 11 and the negative terminal of battery 15 respectively. A load resistor 27 is connected across the diode 20 by leads 25 and 26. Finally, a cathode follower 30 has its grid connected to the plate of the vacuum tube 20 over lead 31. The plate of the cathode follower 30 is shown to be connected over lead 32 to +B, while the output is taken across resistor 35 which is connected between the cathode of the amplifier 30 and ground. As was previously explained, the high frequency response of the circuit of FIGURE 1 is limited by the shunt capacitance present in vacum tube 20 and the bias conditions for the test diode are limited by the maximum power available from the square wave generator 12 which is used to drive the tester.

The operation of the circuit of FIGURE 1 may be explained as follows. With the square wave generator 12 in its quiescent state the battery 15 supplies forward current through the test diode D. The majority of this forward current flows through the low impedance vacuum diode 20 while a small amount wil flow through the load resistor 27. The small voltage drop across resistor 27 is transmitted, with approximately unity gain to the output of the cathode follower which may be direct current coupled to an oscilloscope. With the square wave generator in its negative state the forward biasing effect of battery 15 is exceeded and the test diode D is reverse biased. The reverse current flows entirely through load resistor 27 as the vacuum diode 20 is reverse biased. The negative voltage drop across resistor 27 may then be transmitted through the cathode follower 30 with approximately unity gain to an oscillscope.

In FIGURE 2, there is shown the pentode output type circuit in its simplified form which has eliminated all shunt diodes. This circuit includes test terminals 40 and 41 across which the diode D to be tested is to be placed. A square wave generator 42 is connected to terminal 40 over lead 43 at one end thereof, while the other terminal of the square wave generator 42 is connected over lead 44 to the positive terminal of battery 45. A load resistor 46 is connected between the negative terminal of the battery 45 and the output terminal 41 over leads 47 and 50 respectively. The control grid of pentode 51 is shown to be connected to terminal 41 over lead 52, while the plate of pentode 51 goes to +B through plate resistor 53. Finally, the output is taken across the plate and ground with the cathode of the pentode going to ground.

In operation with the square wave generator 42 in its quiescent state the test diode D is reverse biased by battery 45. Reverse current will thus flow through the load resistor 46 providing an input voltage signal to the output stage of pentode 51 which is amplified. This signal is then observed on an oscilloscope which may be coupled to the plate of pentode 51. With a negative signal from the square wave generator 42, the biasing voltage from battery 45 is exceeded and the test diode D is forward biased. This forward current flows through load resistor 46 producing a negative voltage drop thereacross which is presented to the grid of the pentode 51. This negative signal will drive the pentode to cut-off thus a small response from the forward current through the test diode is transmitted to the output stage.

Figure 3:
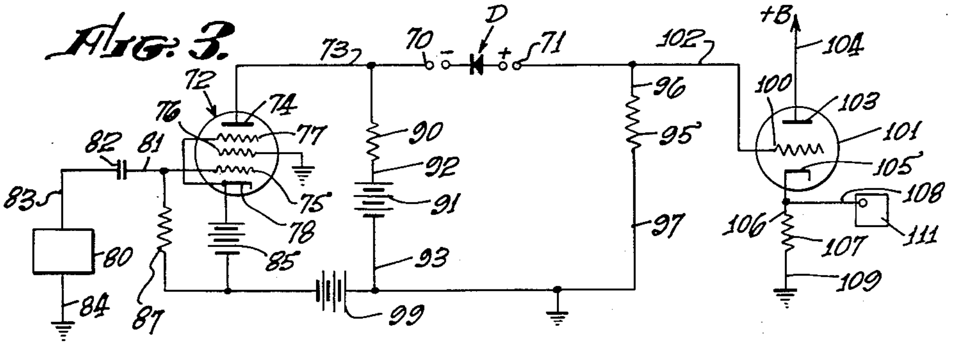
FIGURE 3 is a simplified schematic view of a reverse recovery tester in accordance with the present invention.

A reverse recovery diode tester circuit in accordance with the present invention is shown in FIGURE 3. Therein terminals 70 and 71 receive the diode D to be tested. Terminal 70 is connected to the plate of power amplifier 72 by means of lead 73. Power amplifier 72 includes a plate 74, a control grid 75, a screen grid 76, a suppressor grid 77, and a cathode 78. The grid 75 is capacitor coupled to one side of a square wave generator 80 through lead 81, capacitor 82 and lead 83. The square wave generator 80 has a second terminal thereof going to ground over lead 84. The cathode 78 of the power amplifier 72 is negatively biased by battery 85. The screen grid 76 is grounded and the suppressor grid 77 is connected to the cathode 78. A resistor 87 is connected between the grid of the amplifier 72 and the cathode thereof. A resistor 90 has one end thereof connected to lead 73, while the other end of resistor 90 is connected to the positive terminal of 60 volt battery 91 over lead 92. The negative terminal of battery 91 is connected by means of lead 93 to ground. A 200 volt battery 99 is coupled between terminal 93 and the negative terminal of battery 85. A load resistor 95 is connected intermediate terminal 71 and ground by means of leads 96 and 97. Further, terminal 71 is connected to grid 100 of cathode follower 101 by means of lead 102, while the plate 103 of the cathode follower 101 is connected over lead 104 to +B. The circuit is completed by cathode 105 which is connected through lead 106 and cathode resistor 107 to ground. The output which may lead to a cathode ray oscilloscope is taken across resistor 107 through leads 108 and 109.

In operation, with the square wave generator 80, in its quiescent state, the power amplifier which may be a 3E29 pentode, for example, is biased near cut-off by battery 85 rendering it non-linear. The 60 volt battery 91 reverse biases the test diode D. Reverse current will pass through load resistor 95 producing a voltage drop thereacross. This signal is fed into the grid 100 of cathode follower 101 thus producing a signal with approximately unity power gain across the output terminals 108 and 109 which may be direct current coupled to an oscilloscope 111.

With a positive square wave signal from generator 80, the power amplifier 72 is driven into heavy conduction producing a voltage drop across load resistor 90 causing the plate 74 of amplifier 72 to be below ground. The plate 74 will still be positive with respect to the cathode due to the fact that the 200 volt battery 99 places the cathode at a high negative potential while the plate of the power amplifier is connected through resistor 90 to biasing battery 91 which is at 60 volts. Since ground is now positive with respect to the negative terminal 70 of diode D there will be a negative voltage drop across resistor 95 which is transmitted through the cathode follower to the scope, not shown, with approximately unity power gain. This negative voltage will bias the cathode follower 101 past cut-off, thus forward current indications which would otherwise saturate the oscilloscope 111 are prevented from reaching it. A cathode follower has been used instead of a diode coupling or limiter to avoid the reverse recovery effect introduced by the use of a diode.

The steep trailing edge of the square wave pulse from the square wave generator 80 will return the test diode to the reverse biased state, but the transient reverse current will cause a positive voltage peak at the grid 100 of the cathode follower 101 which is now normally biased. It is this pip which is transmitted through the cathode follower and appears on the oscilloscope 111.

It may be mentioned in passing that the 200 volt battery 99 acts as a plate supply for the power amplifier 72 and does not enter into the reverse biasing of the test diode D. The forward bias of the test diode is supplied through the series circuit defined by resistor 95, the diode D, amplifier 72 and battery 85.

Thus, there has been described a new and improved detector of the reverse recovery effect in semiconductor diodes which permits measurement of extremely fast recovery times. While the present invention has been described with respect to particular parameters, such as the values of the various biasing batteries, it will be understood by one skilled in the art that these values are not critical and that approximate changes may be made to achieve the desired results.

What is claimed is:

1. A circuit for measuring the reverse recovery effect following forward bias in an asymmetrically conductive device comprising: load resistance means connected in series relationship with said conductive device; power amplifying means having its output terminals connected across said conductive device and load resistance means, said power amplifying means normally biasing said conductive device in the forward direction; a cyclic voltage source having a negative output voltage pulse waveform, the output terminals of said cyclic voltage source being connected across the input terminals of said power amplifying means with a steep wave front; indicating means for measuring the current flow through said conductive device; and, limiting means for preventing the transmission to said indicating means of forward current pulses passing through said conductive device, said limiting means being connected across said indicating means, whereby the steep leading edge of the negative output voltage pulse from said cyclic voltage source causes a flow of transient recovery current through said conductive device, the recovery current being measured by said indicating means.

2. A circuit for measuring the reverse recovery effect in an asymmetrically conductive device comprising: load resistance means connected in series relationship with said conductive device; power amplifying means having its output terminals connected across said conductive device and said load resistance means, said power amplifying means normally biasing said conductive device in the reverse direction; a cyclic voltage source having positive output voltage waveform with a rapid decay time from a relatively high to a relatively low voltage level, the output terminals of said cyclic voltage source being connected across the input terminals of said power amplifying means; a cathode ray oscilloscope for measuring the current flow through said conductive device; and cathode follower, limiting means for preventing the transmission to said cathode ray oscilloscope means of forward current pulses passing through said conductive device, said cathode follower limiting means including a cathode follower and a cathode ray oscilloscope, said cathode follower being connected across said load resistance means, the output terminals of said cathode follower limiting means being connected across the input terminals of said cathode ray oscilloscope, whereby a positive output pulse from said cyclic voltage source causes the flow of forward current through said conductive device, the steep trailing edge of the pulse resulting in the flow of transient recovery current through said conductive device and the measurement of the recovery current by said cathode ray oscilloscope.

3. A circuit for measuring the reverse recovery effect in an asymmetrically conductive device comprising: load resistance means connected in series relationship with said conductive device, one terminal of said load resistance means being connected to the positive terminal of said conductive device; non-linear power amplifying means having output terminals connected across said conductive device and said load resistance means, said power amplifying means including a source of direct current potential to normally bias said conductive device in the reverse direction; a cyclic voltage source having a positive output waveform with a rapid decay time from a relatively high to a relatively low voltage level, the output terminals of said cyclic voltage source being connected across the input terminals of said power amplifying means; means for connecting a cathode ray oscilloscope for measuring the current flow through said conductive device; and, limiting means for preventing the transmission to said cathode ray oscilloscope of forward current pulses passing through said conductive device, said limiting means having its input terminals across said load resistance means and its output terminals adapted for connection across the input terminals of said cathode ray oscilloscope, whereby a positive output pulse from said cyclic voltage source causes the flow of forward current through said conductive device, the steep trailing edge of the output pulse resulting in the flow of transient recovery current through said conductive device permitting the measurement of the recovery current by said cathode ray oscilloscope.

4. A circuit for measuring the reverse recovery effect in an asymmetrically conductive device comprising: a load resistor connected in series relationship with said conductive device, one terminal of said load resistor being connected to the positive terminal of said conductive device; a non-linear power amplifier having its output terminals connected across said conductive device and load resistor, said power amplifier including a source of D.C. potential to normally bias said conductive device in the reverse direction; a cyclic voltage source having a positive output waveform with a rapid decay time from a relatively high to a relatively low voltage level, the output terminals of said cyclic voltage source being connected across the input terminals of said power amplifier; a cathode ray oscilloscope for measuring the current flow through said conductive device; and a cathode follower for preventing the transmission to said cathode ray oscilloscope of forward current pulses passing through said conductive device, said cathode follower having its input terminals connected across said load resistor and its output terminals connected across the input terminals of said cathode ray oscilloscope, whereby a positive output pulse from said cyclic voltage source causes the flow of forward current through said conductive device and a negative voltage drop across said load resistor thereby cutting off the output current flow through said cathode follower, the steep trailing edge of the positive voltage pulse resulting in the flow of transient recovery current through said conductive device permitting the measurement of the recovery current by said cathode ray oscilloscope.

5. A circuit for measuring the reverse recovery effect in an asymmetrically conductive device comprising: a load resistor connected in series relationship with said conductive device, one terminal of said load resistor being connected to the positive terminal of said conductive device and the other terminal of said load resistor being connected to ground; non-linear power amplifying means including an amplifying device, a first direct current potential source, a second direct current potential source of greater voltage than said first direct current potential source, and a limiting resistor having one terminal connected to the positive terminal of said amplifier device and the other terminal connected to the positive terminal of said first direct current potential source, the positive terminal of said second direct current potential source being connected to the negative terminal of said first direct current potential source and the negative terminal of said second direct current potential source being connected to the negative terminal of said amplifying device, the output terminals of said power amplifying means connecting the positive terminal of said amplifying device to the negative terminal of said conductive device and the negative terminal of the first direct current potential source to ground, thereby causing said conductive device to normally be biased in the reverse direction; a cyclic voltage source having a positive output waveform with a rapid decay time from a relatively high to a relatively low voltage level, one output terminal of said cyclic voltage source being connected to the input terminal of said amplifier device in said power amplifying means and the other output terminal connected to ground; indicating means for measuring the current flow through said conductive device; and limiting means for preventing the transmission to said indicating means of forward current pulses passing through said conductive device, said limiting means having its input terminals connected across said load resistor and its output terminals connected across the input terminals of said indicating means, whereby a positive output pulse from said cyclic voltage source causes the flow of forward current through said conductive device, the steep trailing edge of the pulse resulting in the flow of transient recovery current through said conductive device permitting the measurement of the recovery current by said indicating means.

6. A circuit for measuring the reverse recovery effect in an asymmetrically conductive device comprising: a load resistor connected in series relationship with said conductive device, one terminal of said load resistor being connected to the positive terminal of said conductive device and the other terminal of said load resistor being connected to ground; power amplifying means including a non-linear amplifying device, a first direct current potential source, a second direct current potential source of greater voltage than said direct current first potential source, and a limiting resistor having one terminal connected to the positive terminal of said amplifier device and the other terminal connected to the positive terminal of said first direct current potential source, the positive terminal of the second direct current potential source being connected to the negative terminal of said first direct current potential source and the negative terminal of said second direct current potential source being connected to the negative terminal of said amplifying device, the output terminals of said power amplifying means connecting the positive terminal of the amplifying device to the negative terminal of said conductive device and the negative terminal of said direct current first potential source to ground, thereby causing said conductive device to normally be biased in the reverse direction; a cyclic voltage source having a positive output waveform with a rapid decay time from a relatively high to a relatively low voltage level, one output terminal of said cyclic voltage source being connected to the input terminal of said amplifier device in said power amplifying means and the other output terminal connected to ground; a cathode ray oscilloscope for measuring the current flow through said conductive device; and a cathode follower for preventing the transmission to said cathode ray oscilloscope of forward current pulses passing through said conductive device, said cathode follower having its input terminals connected across said load resistor and its output terminals connected across the vertical deflection input terminals of said cathode ray oscilloscope, whereby a positive output pulse from said cyclic voltage source causes the flow of forward current through said conductive device and a negative voltage drop across said load resistor thereby cutting off the output current flow through said cathode follower, the steep trailing edge of the positive voltage pulse resulting in the flow of transient recovery current through said conductive device permitting the measurement of the recovery current by said cathode ray oscilloscope.

7. Apparatus for indicating the reverse recovery current of an asymmetrically conductive device as a function of time comprising: means normally biasing said device in the reverse direction, indicating means, signal translating means connected to apply to said indicating means a signal derived from the current through said device, forward biasing means connected to recurrently bias said device in the forward direction, said forward biasing means also being connected to simultaneously recurrently render said signal translating means nonconductive to prevent the transmission to said indicating means of signals derived from forward current through said device.

8. Apparatus for indicating the reverse recovery current of an asymmetrically conductive device as a function of time comprising: first biasing means normally biasing said device in the reverse direction, indicating means, signal translating means connected to apply to said indicating means a signal derived from the current through said device, second biasing means normally biasing said signal translating means to a conductive state, and third biasing means connected in parallel with said second biasing means to recurrently bias said device in the forward direction for predetermined intervals of time and to simultaneously recurrently bias said signal translating means to a non-conductive state to prevent application to said indicating means of signals derived from forward current through said device.

References Cited in the file of this patent

UNITED STATES PATENTS 2,698,419 Blair ------------------ Dec. 28, 1954

OTHER REFERENCES

Shulman: "Journal of Applied Physics," vol. 24, No. 10, Oct. 1953; pp. 1267–1272.

"Recovery Time Measurements on Point-Contact Germanium Diodes," Proceedings of the I.R.E., vol. 43, No. 5, May, 1955; pp. 603–607.

"A Diode Testing Circuit," I.B.M. Technical Disclosure Bulletin, vol. 1, No. 1; June, 1958; pp. 24 and 25.